(12) United States Patent
Sebire (10) Patent No.: US 6,919,829 B2
(45) Date of Patent: Jul. 19, 2005

(54) BIT SWAPPING FOR DIFFERENT INTERLEAVING DEPTHS

(75) Inventor: Benoist Sebire, Espoo (FI)

(73) Assignee: Nokia Corporation, Espoo (FI)

( * ) Notice: Subject to any disclaimer, the term of this patent is extended or adjusted under 35 U.S.C. 154(b) by 25 days.

(21) Appl. No.: 10/601,338

(22) Filed: Jun. 20, 2003

(65) Prior Publication Data

US 2004/0257250 A1 Dec. 23, 2004

(51) Int. Cl.$^7$ .............................................. H03M 7/00
(52) U.S. Cl. ............................ 341/81; 341/63; 341/51
(58) Field of Search ............................ 341/81, 51, 63; 375/296, 295, 264, 285, 278, 284; 714/755, 780; 370/207

(56) References Cited

U.S. PATENT DOCUMENTS

| | | | | |
|---|---|---|---|---|
| 6,259,744 B1 | * | 7/2001 | Lee et al. | 375/264 |
| 6,629,287 B1 | * | 9/2003 | Brink | 714/755 |
| 2002/0186784 A1 | | 12/2002 | Kim et al. | 375/298 |

FOREIGN PATENT DOCUMENTS

| | | |
|---|---|---|
| EP | 1265413 A2 | 12/2002 |
| WO | WO 00/74296 | 12/2000 |

OTHER PUBLICATIONS

3GPP TS 45.003 V5.6.0 (2202–06), 3rd Generation, Partnership Project; Technical Specification Group GSM/EDGE, not date given.

Radio Access Network; Channel coding (Release 5), no date given.

3GPP TS 45.004 V5.1.0 (Jun. 2002), 3rd Generation Partnership Project; Technical Specification Group.

GSM/EDGE Radio Access Network; Modulation (Release 4), no date.

3GPP TR 45.902 V6.0.0 (Apr. 2003), 3rd Generation Partnership Project; Technical Specification Group GSM/EDGE.

Radio Access Network; Flexible Layer One; (Release 6), no date.

* cited by examiner

Primary Examiner—Brian Young (57) ABSTRACT

The invention relates to a method, a system and a computer program product for bit swapping, wherein periodically I successive bits of a data packet that comprises K bits are mapped onto interleaved bit positions in I different bursts, respectively, according to a predefined interleaving scheme and a selected interleaving depth I, comprising the step of swapping the value of at least one bit that is associated with a respective first bit position m in the data packet with the value of a bit that is associated with a respective second bit position n in the data packet, wherein the respective second bit position n is selected such that n>m holds and that the difference n−m is divisible by I.

12 Claims, 7 Drawing Sheets

| k | j | b | k | j | b |
|---|---|---|---|---|---|
| 0 | 0 | 0 | 36 | 49 | 4 |
| 1 | 98 | 1 | 37 | 147 | 5 |
| 2 | 196 | 2 | 38 | 245 | 6 |
| 3 | 294 | 3 | 39 | 343 | 7 |
| 4 | 45 | 4 | 40 | 92 | 0 |
| 5 | 143 | 5 | 41 | 190 | 1 |
| 6 | 241 | 6 | 42 | 288 | 2 |
| 7 | 339 | 7 | 43 | 38 | 3 |
| 8 | 88 | 0 | 44 | 137 | 4 |
| 9 | 186 | 1 | 45 | 235 | 5 |
| 10 | 284 | 2 | 46 | 333 | 6 |
| 11 | 34 | 3 | 47 | 83 | 7 |
| 12 | 133 | 4 | 48 | 180 | 0 |
| 13 | 231 | 5 | 49 | 278 | 1 |
| 14 | 329 | 6 | 50 | 28 | 2 |
| 15 | 79 | 7 | 51 | 126 | 3 |
| 16 | 176 | 0 | 52 | 225 | 4 |
| 17 | 274 | 1 | 53 | 323 | 5 |
| 18 | 24 | 2 | 54 | 73 | 6 |
| 19 | 122 | 3 | 55 | 171 | 7 |
| 20 | 221 | 4 | 56 | 268 | 0 |
| 21 | 319 | 5 | 57 | 18 | 1 |
| 22 | 69 | 6 | 58 | 116 | 2 |
| 23 | 167 | 7 | 59 | 214 | 3 |
| 24 | 264 | 0 | 60 | 313 | 4 |
| 25 | 14 | 1 | 61 | 63 | 5 |
| 26 | 112 | 2 | 62 | 161 | 6 |
| 27 | 210 | 3 | 63 | 259 | 7 |
| 28 | 309 | 4 | 64 | 8 | 0 |
| 29 | 59 | 5 | 65 | 106 | 1 |
| 30 | 157 | 6 | 66 | 204 | 2 |
| 31 | 255 | 7 | 67 | 302 | 3 |
| 32 | 4 | 0 | 68 | 53 | 4 |
| 33 | 102 | 1 | 69 | 151 | 5 |
| 34 | 200 | 2 | 70 | 249 | 6 |
| 35 | 298 | 3 | 71 | 347 | 7 |

| k | k' | b | j | j' |
|---|---|---|---|---|
| 1 | 81 | 1 | 98 | 282 |
| 5 | 1317 | 5 | 143 | 57 |
| 10 | 90 | 2 | 284 | 120 |
| 14 | 1326 | 6 | 329 | 243 |
| 16 | 96 | 0 | 176 | 12 |
| 19 | 1331 | 3 | 122 | 36 |
| 20 | 100 | 4 | 221 | 57 |
| 23 | 1335 | 7 | 167 | 81 |
| 25 | 105 | 1 | 14 | 198 |
| 29 | 1341 | 5 | 59 | 321 |
| 34 | 114 | 2 | 200 | 36 |
| 38 | 1350 | 6 | 245 | 159 |
| 40 | 120 | 0 | 92 | 276 |
| 43 | 1355 | 3 | 38 | 300 |
| 44 | 124 | 4 | 137 | 321 |
| 47 | 1359 | 7 | 83 | 345 |
| 49 | 129 | 1 | 278 | 114 |
| 53 | 1365 | 5 | 323 | 237 |
| 58 | 138 | 2 | 116 | 300 |
| 62 | 1374 | 6 | 161 | 75 |
| 64 | 144 | 0 | 8 | 192 |
| 67 | 1379 | 3 | 302 | 216 |
| 68 | 148 | 4 | 53 | 237 |
| 71 | 1383 | 7 | 347 | 261 |

BIT SWAPPING FOR DIFFERENT INTERLEAVING DEPTHS

FIELD OF THE INVENTION

The invention relates to a method for bit swapping, wherein periodically I successive bits of a data packet that comprises K bits are mapped onto interleaved bit positions in I different bursts, respectively, according to a predefined interleaving scheme and a selected interleaving depth I, comprising the step of swapping the value of at least one bit that is associated with a respective first bit position m in the data packet with the value of a bit that is associated with a respective second bit position n in the data packet, wherein the respective second bit position n is selected such that n>m holds and that the difference n−m is divisible by I.

BACKGROUND OF THE INVENTION

In most of the state-of-the-art communications systems, information originating from an information source is converted into bits, subsequently source and channel encoded, interleaved and then modulated for transmission over a transmission medium, which may be the space between a transmit and a receive antenna or a wired connection such as a cable or an optical fiber. Among the different modulation techniques, phase modulation has proven itself as robust and effective way of mapping information onto a carrier wave. In phase modulation, the phase of the carrier wave contains the complete information on the transmitted bits.

Figure 1:
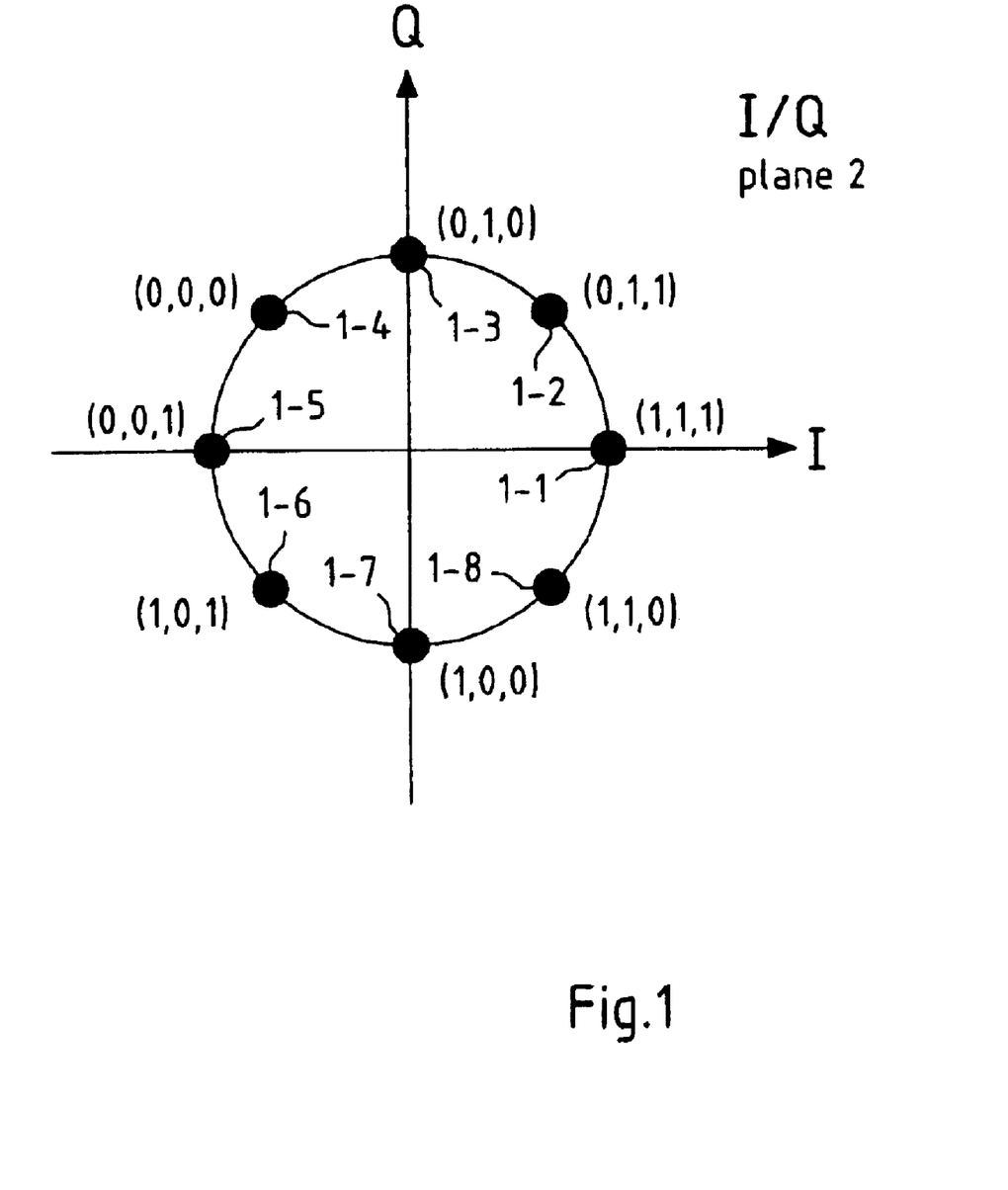
FIG. 1: The symbol mapping of triples of bits into 8-PSK symbols.

EDGE (Enhanced Data GSM Environment), a faster version of the Global System for Mobile Communications (GSM) wireless service, is designed to deliver data at rates up to 384 kbps and enables the delivery of multimedia and other broadband applications to mobile phone and computer users. The EDGE standard is built on the existing GSM standard. However, instead of the Gaussian Minimum Shift Keying (GMSK) modulation technique that was originally standardised for GSM, in EDGE Phase Shift Keying (PSK) with eight possible symbol constellations (8-PSK) is used. The mapping of three consecutive bits ($d_{3i}$, $d_{3i+1}$, $d_{3i+2}$) of an encoded, interleaved bit stream bound for modulation onto one out of eight possible 8-PSK symbols 1-1 . . . 1-8 in the I/Q-plane 2 is depicted in FIG. 1, where i denotes the sequential number of the 8-PSK symbol and where the I-axis and Q-axis refer to the inphase and quadrature component of the modulated signal, respectively. All 8-PSK symbols 1-1 . . . 1-8 lie on a circle with the same radius and only differ in their phase, which is counted counter-clockwise starting from the I-axis.

When trying to demodulate a received noisy 8-PSK signal symbol-wise in order to determine the associated three transmitted bits ($d_{3i}$, $d_{3i+1}$, $d_{3i+2}$) per 8-PSK symbol, the phase of the received signal is determined by decomposing the received signal into its inphase and quadrature components, yielding an estimated position of the 8-PSK symbol in the I/Q-plane 2 (not shown). The estimated position is compared with the possible eight positions 1-1 . . . 1-8 as depicted in FIG. 1 in order to determine which 8-PSK symbol was originally sent. However, if the symbol estimate substantially differs from the possible 8-PSK symbol positions, e.g. if the estimated symbol has a phase of 22.5°, although the transmitted 8-PSK symbol 1-1 had a phase of 0° (corresponding to the three bits (1,1,1)), it is difficult to decide whether the symbol 1—1 with phase 0° or the symbol 1-2 with phase 45° was originally sent. If it is erroneously decided that the 8-PSK symbol 1-2 with phase 45° was sent, the demodulation yields the bits (0,1,1) instead of the bits (1,1,1) that were originally sent. Thus one bit error occurs. From FIG. 1, it can be noted that neighbouring 8-PSK symbols always differ in only one bit position, in order to keep the number of bit errors as low as possible when erroneously deciding for the neighbouring 8-PSK symbol instead of the originally sent 8-PSK symbol. However, even for errors arising from the detection of erroneous neighbouring 8-PSK symbols instead of the correct 8-PSK symbol, the error probability in the bit triple ($d_{3i}$, $d_{3i+1}$, $d_{3i+2}$) is not equal. Detecting the neighbouring 8-PSK symbol instead of the correct 8-PSK symbol may lead to a bit error in the first position of the triple ($d_{3i}$, $d_{3i+1}$, $d_{3i+2}$) for only 4 8-PSK symbols (1-1, 1-2, 1-5 and 1-6 at 0°, 45°, 180° and 225°, respectively), may lead to a bit error in the second position of the triple ($d_{3i}$, $d_{3i+1}$, $d_{3i+2}$) for only 4 8-PSK symbols (1-3, 1-4, 1-7, 1-8 at 90°, 135°, 270° and 315°, respectively), and may lead to a bit error in the third position of the triple ($d_{3i}$, $d_{3i+1}$, $d_{3i+2}$) for all 8 8-PSK symbols 1-1 . . . 1-8. The third bit position in the triple ($d_{3i}$, $d_{3i+1}$, $d_{3i+2}$) is thus much more error prone than the first and second bit position, and is thus denoted as the "weak bit" of the triple. The EDGE system (cf. technical document 3GPP TS 45.003 V5.6.0 (2000–06) from the European Telecommunications Standardisation Institute (ETSI)) allows for the multiplexing of several mobile stations onto a single uplink Packet Data Transport Channel (PDTCH). In order to control access of the different mobile stations to the PDTCH, the Uplink State Flag (USF) is used, which indicates whether or not an uplink channel is free, and, if not free, which mobile station it currently belongs to. The USF has three bits, where a "1" stands for "free", and the remaining 7 states can be used to identify the MS that is currently using the PDTCH. The USF flag is vital for the proper functioning of the EDGE system and thus is channel encoded by a block code with code rate 1/12. In particular, the three bits of the USF are mapped onto 36 coded USF bits, and these 36 bits are distributed onto four consecutive blocks as groups of 9 bits each.

Figure 2:
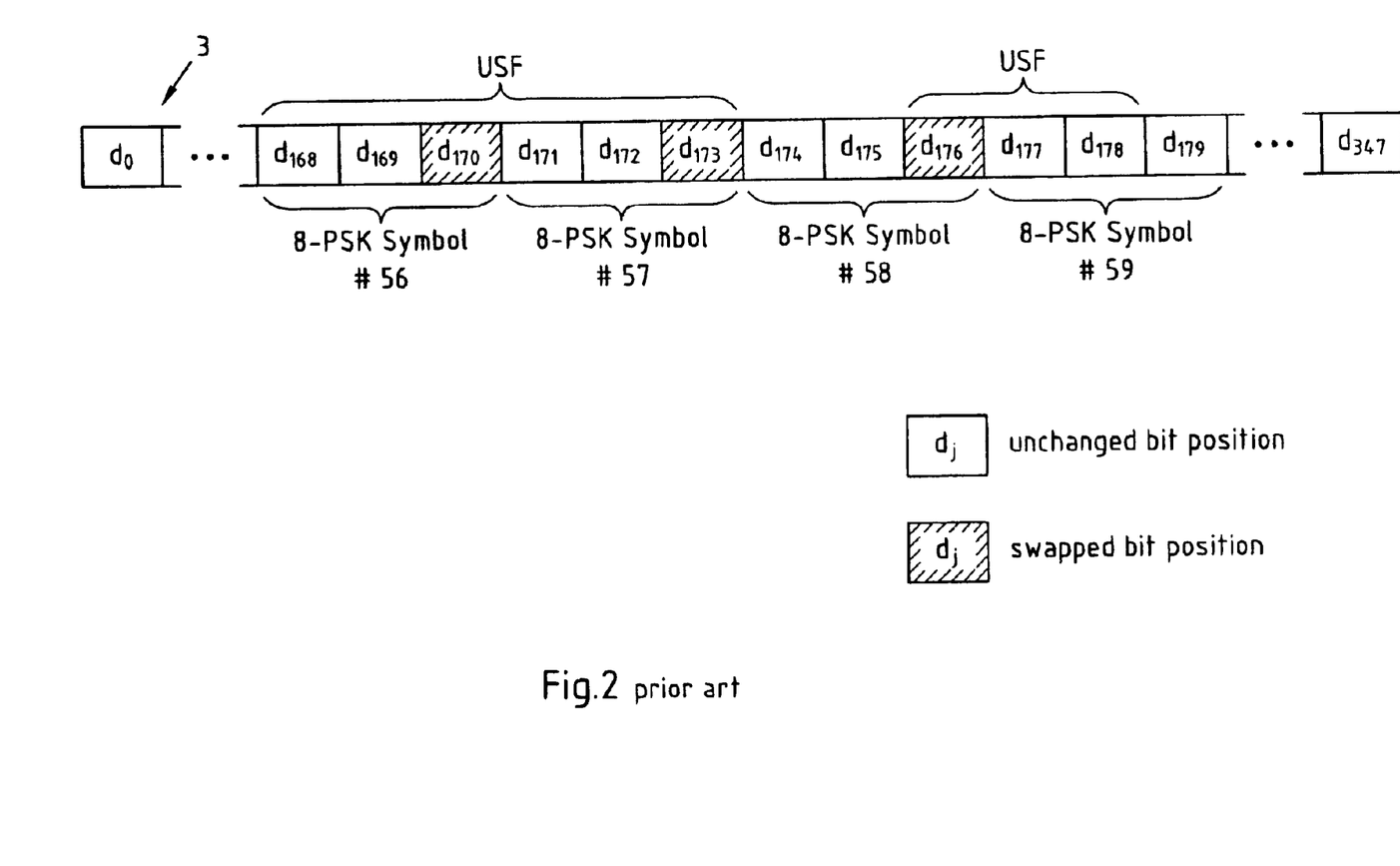
FIG. 2: an example for prior art bit swapping in one block of a GSM/EDGE burst.

As shown in FIG. 2, which depicts the first block 3 out of four blocks of an GSM/EDGE burst, each of the blocks comprises 348 bits in total, where the coded USF bits are arranged at bit positions 168 to 173 and 176 to 178, respectively. The remaining bit positions in each block are filled with already interleaved, coded and rate-matched header and data bits. The four blocks then form a burst of length 1392 bits.

EDGE comprises thirteen different Modulation and Coding Schemes (MCS) for the PDTCH. In MCS-5 and MCS-7 (both uplink and downlink), it is proposed to avoid the transmission of coded USF bits at the third bit position in the 8-PSK triple ($d_{3i}$, $d_{3i+1}$, $d_{3i+2}$) in order to decrease the bit error ratio of the USF. This principle is known as bit swapping. Bit swapping means that coded USF bits that correspond to bit positions in the burst that otherwise would be transmitted as the third bit in the 8-PSK triple ($d_{3i}$, $d_{3i+1}$, $d_{3i+2}$) are swapped with bit positions that correspond to interleaved coded and rate-matched data bits and will not be transmitted as the third bit in the 8-PSK triple ($d_{3i}$, $d_{3i+1}$, $d_{3i+2}$). Thus USF bits are only transmitted as first or second bit in the 8-PSK ($d_{3i}$, $d_{3i+1}$, $d_{3i+2}$), which helps to reduce the bit error ratio of the USF. As depicted in FIG. 2, the USF bits at positions 170, 173 and 176 (in the 8-PSK symbols 56, 57 and 58, respectively, shaded grey in FIG. 2) are swapped with interleaved, coded and rate-matched data bits at positions 150, 151 and 195 (not shown). It can easily be seen that, when the first bit in a burst has position 0, the USF bit positions 168, 169, 171, 172, 177, 178 (unchanged) and 150, 151 and 195 (swapped) correspond to less error prone first and second bit positions in the 8-PSK triple ($d_{3i}$, $d_{3i+1}$, $d_{3i+2}$), because only bit positions 3k−1, with k=1 . . . 464, are mapped to the error-prone third bit position in the triple.

Swapping takes place at the transmitter. At the receiver, inverse swapping (de-swapping) of the bits yield from the demodulation of the received 8-PSK symbols is performed based on knowledge of the swapping algorithm that was used on the transmitter site. After de-interleaving, both the group of TFCI bits and the group of channel coded and rate-matched data bits are channel de-coded and then further processed.

Of course, the bit error ratio of the data bits is increased accordingly when applying bit swapping, because the error-prone third bit position in the 8-PSK triple is now assigned to the data bits more frequently. However, the performance degradation of the bit error ratio of the data bits is willingly accepted when it can be traded against the reduced bit error ratio of the by far more important USF.

A similar situation arises in the context of the Flexible Layer One (FLO), a new type of physical layer that is proposed for the GSM/EDGE Radio Access Network (GERAN, cf. technical document 3GPP TR 45.902 V6.0.0 (2003–04) from ETSI). The main advantage of the FLO is that the configuration of the physical layer (e.g. channel coding and interleaving) is specified at call setup. With FLO, the physical layer of GERAN offers one or several transport channels to the Medium Access Control (MAC) sublayer. A number of transport channels can be multiplexed and sent on the same basic physical channel, the Coded Composite Transport Channel (CCTrCH) at the same time. The configuration of a transport channel, i.e. the number of input bits, channel coding, interleaving etc. is denoted the Transport Format (TF). The configuration of the transport formats is completely controlled by the Radio Access Network (RAN) and signalled to the MS at call setup. In both the mobile station and the base transceiver station, the transport formats are used to configure the encoder and decoder units. Only a limited number of combinations of the TFs of different Traffic Channels (TrCH) are allowed. A valid combination is called a Transport Format Combination (TFC). In order to decode the received sequence the receiver needs to know the active TFC for a radio packet. This information is transmitted in the Transport Format Combination Indicator (TFCI) field. This field is a basic layer 1 header. From the decoded TFCI value the transport formats for the different transport channels are known and the actual decoding can start.

The size of the TFCI is limited to a maximum of 5 bits, allowing a maximum of 32 different TFCs on the same basic physical subchannel. In other words, for a single connection, it is proposed to have a maximum of 32 different channel coding and/or multiplexing possibilities at a time.

The TFCI is block-encoded and inserted at the beginning of a non-interleaved radio packet that further comprises the multiplexed transport channels (the CCTrCH). Each transport block of bits that is to be transmitted on a TrCH is furnished with a Cyclic Redundancy Check (CRC) attachment, channel encoded, rate-matched and then multiplexed with the other coded blocks to yield a Coded Combined Transport Channel (CCTrCH). In full rate 8-PSK channels, the non-interleaved radio packet, comprising the TFCI and the CCTrCH bits, has a total length of 1392 bits. Before 8-PSK modulation takes place, the bits of the non-interleaved radio packet are either block diagonally or block rectangularly interleaved onto I bursts, where I denotes the interleaving depth.

In the case of block rectangular interleaving, the I bursts represent a radio packet. For instance, in full rate 8-PSK channels, the K=1392 bits of the non-interleaved radio packet are then interleaved onto 4 bursts of size J=348 bits, which form the radio packet that is bound for 8-PSK modulation.

In the case of block diagonal interleaving, the bits of the non-interleaved radio packet, which comprises M=K/J non-interleaved bursts, are interleaved onto I=2*M bursts of size J bits. However, the first I/2 bursts contain only bits on the even bit positions, whereas the last I/2 bursts contain only bits on the odd bit positions. The bits of these I bursts thus have to be combined with the bits of further I bursts that stem from interleaving of the next non-interleaved radio packets onto I bursts, yielding two brimming radio packets from the two non-interleaved radio packets.

Due to the importance of the TFCI for decoding received radio packets, it is desirable to improve the bit error ratio of the TFCI. This can be achieved by bit swapping. However, in contrast to the bursts setup in the context of MSC-5 and 7 of EDGE, where the interleaving takes place before the USF bits, data and header bits are arranged in a burst and modulated, for the FLO, the bits of the TFCI and the CCTrCH are jointly interleaved.

As a consequence, in the context of MSC-5 and 7, bit swapping can be directly performed after the burst has been constructed, because it is evident which bits of the burst will be transmitted as "weak bits" of the 8-PSK modulation. For the FLO, in contrast, the joint interleaving of TFCI and CCTrCH yields I bursts, in which it is evident which bits will be transmitted as "weak bits". However, due to the joint interleaving of TFCI and CCTrCH, the position of the interleaved bits of the TFCI within the radio packet depends on the applied interleaving scheme (block diagonal or block rectangular) and the different interleaving depths I (1, 2, 4, 8, 16) that are possible for the full, half and possible future quarter rate channels, respectively. Bit swapping thus has to cope with the different interleaving schemes and interleaving depths I.

Furthermore, it is generally preferred that bit swapping is only performed between bits that are located in the same burst. This avoids affecting the temporal diversity which is the main goal of interleaving.

SUMMARY OF THE INVENTION

In view of the above mentioned problems, it is thus an object of the present invention to develop a simple method, system and computer program product for swapping of higher prioritised bits with lower prioritised bits in a radio packet for systems that jointly interleave the higher and lower prioritised bits and allow for different interleaving depths.

A method for bit swapping is proposed, wherein periodically I successive bits of a data packet that comprises K bits are mapped onto interleaved bit positions in I different bursts, respectively, according to a predefined interleaving scheme and a selected interleaving depth I, comprising the step of swapping the value of at least one bit that is associated with a respective first bit position m in the data packet with the value of a bit that is associated with a respective second bit position n in the data packet, wherein the respective second bit position n is selected such that n>m holds and that the difference n−m is divisible by I.

The bit at respective bit position m may for instance represent a high prioritized bit, and the bit at respective bit position n then represents a low prioritized bit. Swapping is performed by exchanging the value of the bits at both bit positions, i.e. for instance the bit at bit position m is assigned the value of the bit at bit position n and vice versa, if swapping is performed prior to interleaving. The bit associated with a respective first bit position m in the data packet then equals the bit at bit position m, and the bit associated with a respective second bit position n in the data packet then equals the bit at bit position n.

Interleaving is performed by periodically mapping I successive bits of the data packet onto interleaved bit positions in I different bursts, respectively. This may for instance be performed by periodically mapping the bits in the data packet at bit positions k*I+i with k=0, . . . , K/I−1 and with i=0, . . . , I−1, to different interleaved bit positions in burst i. The position of the interleaved bits within the bursts is determined by the interleaving scheme, which may for instance be block diagonal or block rectangular.

Swapping in each step is performed for bit positions m and n in the data packet, where n may for instance be linked to m via a fixed mapping m=n+N, wherein N is a predefined natural number. In order to ensure that the swapped bits are located within the same burst, the difference of both bit positions, i.e. n−m=N, has to be divisible by I, because interleaving is periodic in I.

Both swapping and interleaving are performed at the transmission site, which, depending on the transmission direction, may for instance either be a mobile station or a base transceiver station of a mobile radio system. At the receiving site, corresponding inverse swapping (de-swapping) and de-interleaving has to be performed to rearrange the bits in a manner that channel de-coding can take place. As for swapping, in de-swapping the value of at least one bit that is associated with a respective first bit position m in the data packet is swapped with the value of a bit that is associated with a respective second bit position n in the data packet, wherein the respective second bit position n is selected such that n>m holds and that the difference n−m is divisible by I. The swapping step performed at a transmitter thus also describes the de-swapping step performed at a receiver.

According to the present invention, swapping may be performed before, during or after the interleaving of the at least I successive bits. Correspondingly, at the receiver site, de-swapping has to be performed after, during or prior to de-interleaving, respectively.

When swapping is performed prior to interleaving, the values of the bits in the data packet at the bit positions m and n can be swapped directly. The bit that is associated with a respective first bit position m in the data packet then is the bit at bit position m in the data packet, whereas the bit that is associated with a respective second bit position n is the bit at bit position n in the data packet. At the receiver site, de-swapping then is performed after de-interleaving, and the values of the bits at the same positions m and n are de-swapped as during bit swapping on the transmitter site.

In contrast, when interleaving already has been performed, the values of the bits that now have been mapped to the interleaved bit positions in the I bursts have to be swapped. These interleaved bit positions are one-to-one related to the position of the bit in the data packet via the predefined interleaving scheme and the selected interleaving depth. The bit that is associated with a respective first bit position m in the data packet then is the bit on the interleaved bit position to which the bit at bit position m in the data packet has been interleaved to, whereas the bit that is associated with a respective second bit position n in the data packet then is the bit on the interleaved bit position to which the bit at bit position n in the data packet has been interleaved to. It is thus possible to perform the swapping of the values of bits, which are for instance chosen according to their bit position in the data packet, after interleaving, i.e. by swapping the values of the bit on the interleaved bit positions in the bursts. At the receiver site, de-swapping then has to be performed prior to de-interleaving based on the same swapped interleaved bit positions as on the transmitter site.

According to the present invention, the selected interleaving depth I is preferably taken from a predefined set of interleaving depths $\{I_1, \ldots, I_R\}$, wherein $I_r \leq I_{max}$ holds for all r=1, . . . , R, and wherein the respective second bit position n is preferably selected such that the difference n−m is divisible by $I_{max}$.

If different values for the interleaving depth I are possible, it is advisable to demand that N is not only divisible by the interleaving depth I which is currently applied, but by the maximum interleaving depth $I_{max}$ which is possible. Due to the fact that different possible interleaving depths are powers of 2, demanding that N has to be divisible by $I_{max}$ ensures that for each possible I, the swapped bits are located within the same burst, thus leaving temporal diversity unaffected.

According to the present invention, it is preferred that at least one group of bits is defined within the data packet, and wherein the step of swapping is only performed if the interleaved bit position, to which the bit at the respective first bit position m in the data packet is mapped according to the predefined interleaving scheme and the selected interleaving depth I, is a characteristic interleaved bit position, and if the bit at the respective first bit position m in the data packet belongs to the at least one group of bits.

The group of bits within the data packet may represent high prioritized bits, whereas the remaining bits in the data packet may then represent low prioritized bits. Swapping is only performed for high prioritized bits that, via interleaving, are mapped onto interleaved bit positions in the bursts that are considered as characteristic interleaved bit positions.

According to the present invention, it is further preferred that the characteristic interleaved bit positions are characterised in that, depending on the modulation scheme, the bits on these positions suffer from a higher error probability when the bits are modulated, transmitted over a noisy channel and demodulated as compared to the bits on the remaining positions. Such "weak" bit positions for instance occur for each third bit in 8-PSK modulation, but also are encountered in 16- and 64-Quadrature Amplitude Modulation (QAM).

According to the present invention, the characteristic interleaved bit positions may be the positions j within a burst that fulfil the criterion that (j+1) is divisible by p, wherein p is a predetermined natural number larger than 0. For instance, if the bits on the interleaved bit positions in the bursts are to be 8-PSK modulated, each third bit will be a "weak bit", and for each position j within a burst, with j ranging from zero to the length of a burst minus 1, every "weak bit" is identified by the criterion (j+1) mod p=0 with p=3.

According to the present invention, it is preferred that the group of bits comprises a predetermined number L of first bits of the data packet. The high prioritised bits may then represent a kind of header that is added at the beginning of a data container.

According to the present invention, it is further preferred that the respective second bit position n is selected such that n−m≧L holds. This condition ensures that high prioritized bits of the coherent group of L bits at the beginning of the data packet are swapped with low prioritized bits that are located in the remaining part of the data packet.

According to the present invention, it is preferred that the data packet comprises the bits of a Transport Format Combination Identifier (TFCI) according to a Flexible Layer One (FLO) of a GSM/EDGE Radio Access Network (GERAN) in the group of L bits and the bits of a Coded Composite Transport Channel (CCTrCH) according to the FLO of the GERAN in the remaining K−L bits, wherein the K bits of the data packet are mapped onto the interleaved bit positions in the bursts according to one of the interleaving schemes and one of the interleaving depths I that are standardised for the FLO of the GERAN, and wherein p=3 holds. The condition p=3 accounts for the 8-PSK modulation in the FLO of the GERAN. In the FLO of GERAN, different interleaving depths I taken from the set {4, 8, 16}, different full and half rate channels and block diagonal and block rectangular interleaving schemes are standardised.

According to the present invention, it is preferred that the step of swapping is performed at least two times for the data packet, wherein the respective first bit position m in each step is different, wherein in at least one of the at least two steps, the respective second bit position n is selected such that n=m+N holds, and wherein in at least one of the at least two steps, the respective second bit position n is selected such that n=m+K−N holds, where N is a predetermined natural number. Alternating swapping can be achieved by a counter variable cpt, which is initialized with zero before the first swapping and increased by one after each swapping. If (cpt mod 2=0), m is swapped with n=m+N, and otherwise, m is swapped with n=m+K−N. The rationale behind this alternating swapping with bits at the beginning of the CCTrCH and at the end of the CCTrCH is that error protection in the CCTrCH is strongest at the beginning and the end of the CCTrCH, respectively, so that the bits of the CCTrCH that are transmitted on "weak" bit positions in order to enable the transmission of TFCI bits on less error prone bit positions does not degrade the bit error ratio of the CCTrCH too much.

Furthermore, a system for bit swapping is proposed, wherein periodically I successive bits of a data packet that comprises K bits are mapped onto interleaved bit positions in I different bursts, respectively, according to a predefined interleaving scheme and a selected interleaving depth I, the system comprising processing means for swapping the value of at least one bit that is associated with a respective first bit position m in the data packet with the value of a bit that is associated with a respective second bit position n in the data packet, wherein the respective second bit position n is selected such that n>m holds and that the difference n−m is divisible by I. The system may be either contained in the transmitter (e.g. a mobile station or base transceiver station of a mobile radio system), where swapping is performed, and/or at the receiver, where de-swapping is performed. The means for swapping at the transmitter and de-swapping at the receiver are the same.

Furthermore, it is proposed a computer program product directly loadable into the internal memory of a digital computer, comprising software code portions for performing the steps of the above mentioned method claims when the product is run on a computer. The computer may already be present in a mobile station or base transceiver station for performing the burst construction and interleaving.

BRIEF DESCRIPTION OF THE FIGURES

These and other aspects of the invention will be apparent from and elucidated with reference to the embodiments described hereinafter. In the figures show.

DETAILED DESCRIPTION OF THE INVENTION

Figure 3:
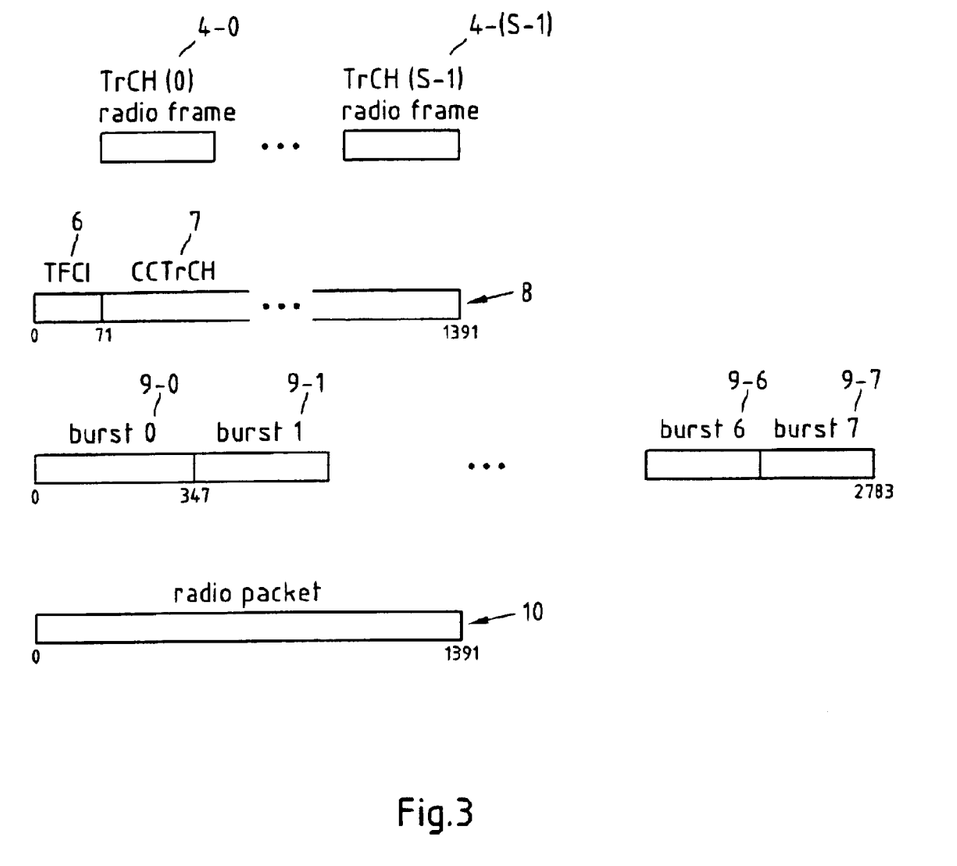
FIG. 3: the structure of a radio packet in the Flexible Layer One (FLO) of GSM/EDGE.

FIG. 3 depicts the structure of a radio packet in the Flexible Layer One (FLO) of GSM/EDGE for the full rate 8-PSK channels. Each transport block, which contains binary layer 2 data of a Traffic Channel (TrCH), is enlarged by a Cyclic Redundancy Check (CRC) attachment yielding a code block, and subsequently channel encoded and rate-matched yielding a radio frame. In FIG. 3, only the radio frames 4-0 and 4-(S−1), corresponding to TrCH(0) and TrCH(S−1), respectively, are shown, where S denotes the number of active TrCHs. For each radio packet to be transmitted, one radio frame 4-s with s=0, . . . , S−1 from each active TrCH is delivered to the TrCH multiplexing. These radio frames 4-s are serially multiplexed into a Coded Composite Transport Channel (CCTrCH). After addition of the TFCI bits 6, in this example configuration 72 bits, at the beginning of the CCTrCH bits 7, a non-interleaved radio packet 8 is yield, which comprises a total of 1392 bits.

The TFCI 6 and the CCTrCH bits 7 that form the non-interleaved radio packet 8 can now be interleaved either block rectangularly onto I=4 bursts 9-0 . . . 9-3, or block diagonally onto I=8 bursts 9-0 . . . 9-7, wherein in any case, each burst has a size of J=348 bits. However, for the block diagonal interleaving, the I=8 bursts only contain bits at the even (bursts 9-0 . . . 9-3) or odd bit positions (bursts 9-4 . . . 9-7). In FIG. 3, the case of block diagonal interleaving with I=8 is exemplarily depicted. Together with the bits at even and odd bit positions of a second non-interleaved burst that is mapped to another I=8 bursts, two brimming FLO radio packets 10 of respective length 1392 bits can be constructed. However, for simplicity of presentation, in FIG. 3 only one of the radio packets 10 is depicted. The FLO radio packets 10 then are subject to 8-PSK modulation.

In technical document 3GPP TR 45.902 V6.0.0, the interleaving which maps the K bits of the non-interleaved radio packet 8 onto I bursts with J bits each is defined by the following set of equations:

Block diagonal interleaving with interleaving depth I:

$$D = I$$

$$j = \frac{D}{M} \cdot \left[(49 \cdot (k+s)) \bmod \frac{J}{D/M}\right] + int\left[\frac{k \bmod D}{M}\right],$$

$$s = \begin{cases} int\left[\frac{k}{K/2}\right] & \text{for } \frac{K}{2} \bmod D = 0, \\ 0 & \text{else.} \end{cases}$$

$$k = 0,1,2,\ldots K-1,$$

$$b = k \bmod D.$$

Block rectangular interleaving with interleaving depth I:

$$D = 2 \cdot I$$

$$j = \frac{D}{M} \cdot \left[(49 \cdot (k+s)) \bmod \frac{J}{D/M}\right] + int\left[\frac{k \bmod D}{M}\right],$$

$$s = \begin{cases} int\left[\frac{k}{K/2}\right] & \text{for } \frac{K}{2} \bmod D = 0, \\ 0 & \text{else.} \end{cases}$$

$$k = 0,1,2,\ldots K-1,$$

$$b = k \bmod \frac{D}{2}.$$

In this context, the function "int [j]" means rounding down to the next smallest natural number with respect to j, whereas the modulo operator "i mod j" returns the remainder of the division i/j.

The equations are applied as follows: Each bit at position k=0 . . . K−1, where K is the size of the non-interleaved/interleaved radio packet in bits, comprising M non-interleaved bursts, is mapped to an interleaved bit position j=0 . . . J−1 within the burst b=0 . . . I−1, where J is the size of both the non-interleaved bursts and the bursts in bits.

Figure 4:
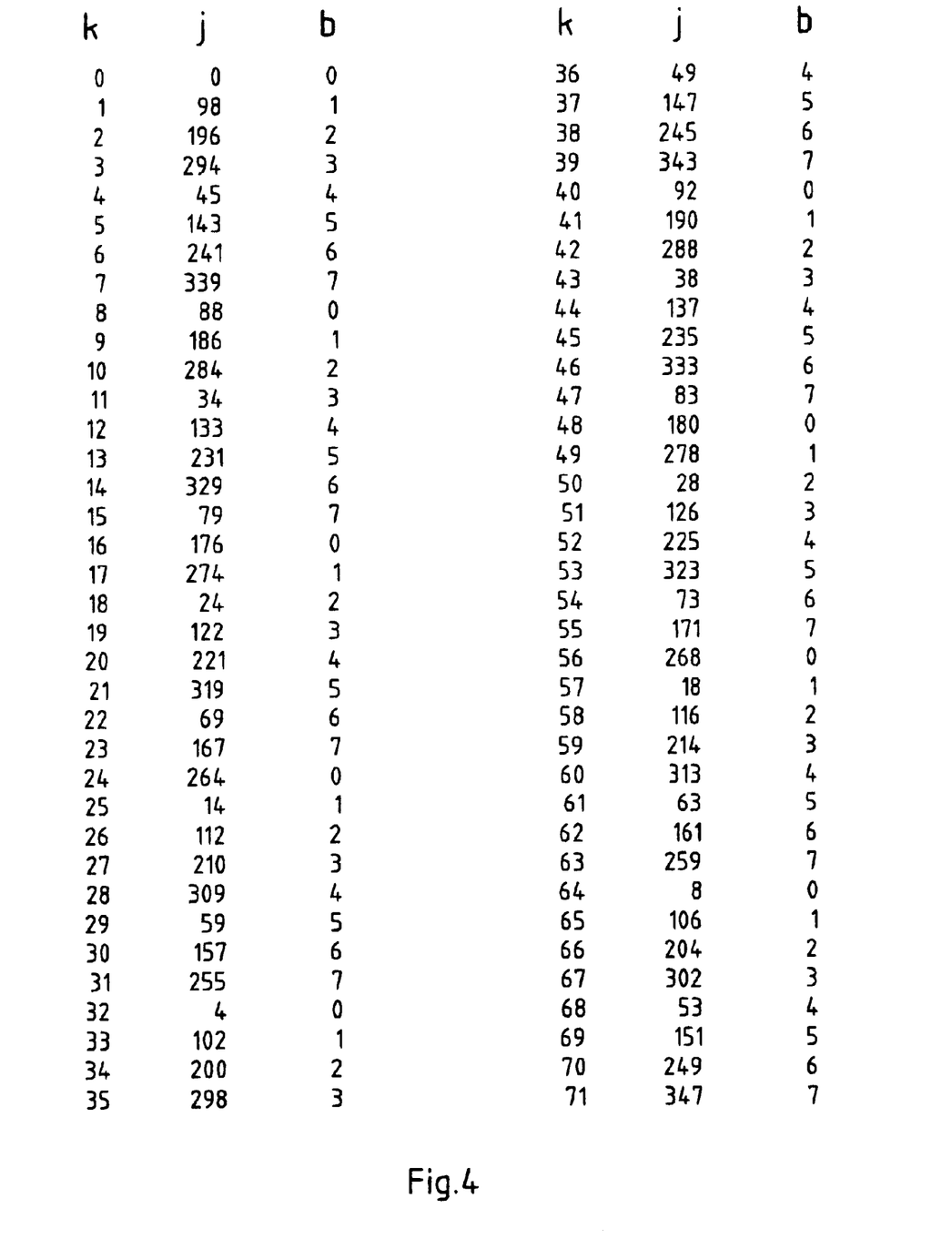
FIG. 4: an interleaving table for the first 72 bits of a full rate 8-PSK radio frame in the FLO of GSM/EDGE for block diagonal interleaving and an interleaving depth I=8.

FIG. 4 depicts an interleaving table for the first 72 bits (the TFCI bits) of a radio frame in the FLO of GSM/EDGE that obeys the above equations and sets out from the parameter set K=1392 and J=348 (M=4), i.e. full rate 8-PSK channels. Furthermore, block diagonal interleaving with an interleaving depth of I=8 is assumed.

The first column of FIG. 4 shows the index k of the bit within the non-interleaved radio packet 8 before interleaving, the second column shows the assigned index j within the corresponding burst b after interleaving, and the third column shows the assigned burst index b after interleaving.

As can be seen from the first and third column of FIG. 4, periodically consecutive bits of the non-interleaved radio packet 8 are mapped onto different bursts b, respectively. Furthermore, it can be seen that in the first four bursts b=0, 1, 2, 3, only the even bit positions j are assigned a value, whereas for the last four bursts b=4, 5, 6, 7, only the odd bit positions are assigned a value. Thus the bits from k=0 . . . 1392 bit positions, i.e. 4 blocks of 348 bits each, are mapped on I=8 bursts with J=348 bit positions each, but each of these bursts comprises only bits at the even or odd bit positions.

The radio packet then is subject to 8-PSK modulation, which results in every third bit of the radio packet being more error prone than the other bits. Note that, due to the fact that the burst size in bits J=348 is divisible by three, the position of a bit within a burst is sufficient to decide whether the bit will be at the third bit position of the corresponding 8-PSK symbol, i.e. the absolute bit position in the radio packet is not required. The TFCI bits that will be transmitted as the third bit can be easily identified by searching for the indices j that correspond to the first k=0 . . . 71 bit positions and fulfil the criterion (j+1) mod 3=0. This is the case for bit positions k=1, 5, 10, 14, 16, 19, 20, 23, 25, 29, 34, 38, 40, 43, 44, 47, 49, 53, 58, 62, 64, 67, 68 and 71 (also see FIG. 6). To improve the TFCI bit (or frame) error ratio, the bits on these bit positions are now swapped with bits from the CCTrCH as proposed by the present invention, i.e. bit k is swapped with bit k+N when cpt is even and with bit k+(K−N) when cpt is odd, where N is a predetermined natural number and where cpt is a counter that is initialized with zero when starting the swapping procedure and is increased by one after each swapping operation. Note that alternatingly swapping bit k with bit k+N and bit k+(K−N) only ensures that the bits of the TFCI are swapped with bits at the beginning and the end of the CCTrCH, where error protection is strongest. Alternatively, bit k may be swapped with bit k+N irrespective of the value of cpt, which simplifies the procedure, but may increase the bit error ratio of the CCTrCH even further.

Figure 5:
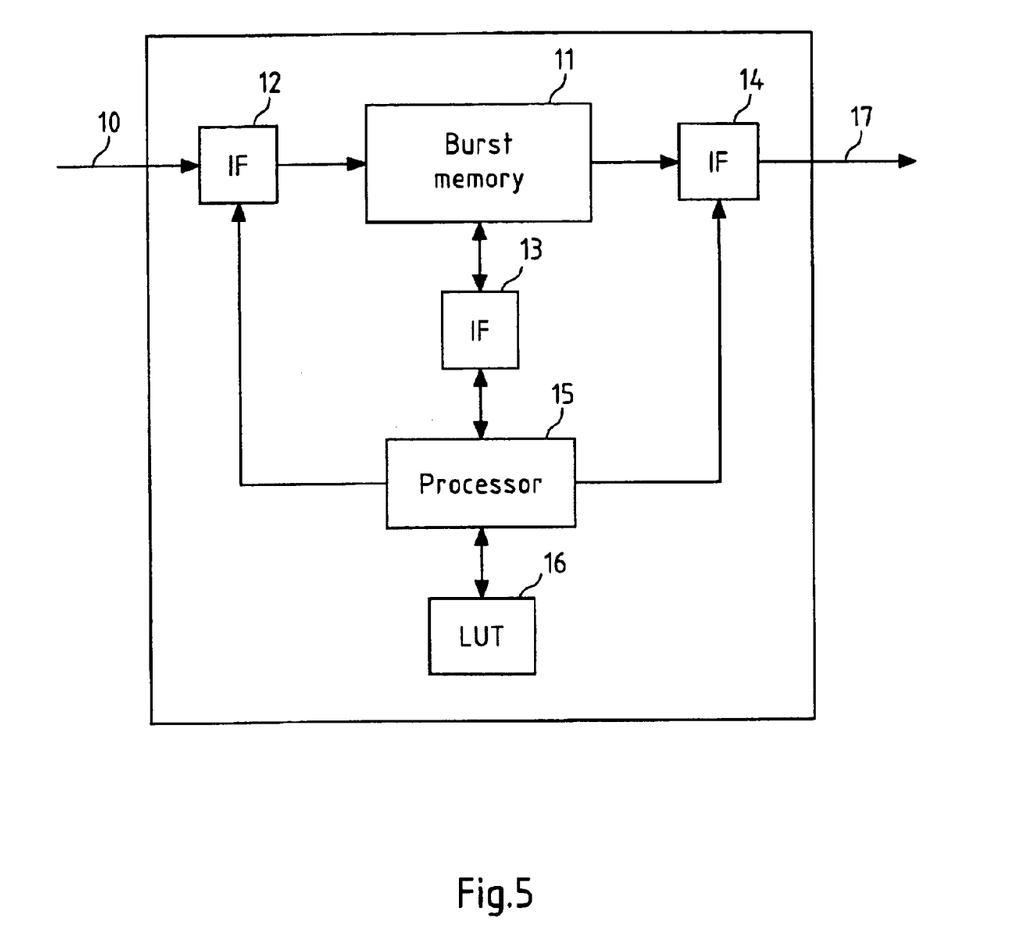
FIG. 5: a block diagram of a system for bit swapping according to the present invention.

FIG. 5 depicts a block diagram of a system for bit swapping according to the present invention. The system comprises a burst memory 11 with interfaces (IF) 12, 13 and 14, a processor 15 for controlling the interfaces 12, 13 and 14 and a look-up-table (LUT) 16. Via IF 12, the processor controls the burst-wise storage of bursts of an interleaved radio packet 10 that stems from a previous interleaving stage into the burst memory 11, which may be implemented as a RAM. When the burst is stored in the RAM, the processor, via interface 13, swaps bits of the stored burst according to the swapping information that is contained in the LUT 16 for the present interleaving scheme and interleaving depth I. Finally, the processor triggers the reading from the burst out of memory 11 via interface 14. The swapped bursts 17 then are forwarded to a modulator stage.

The above description assumed the swapping to be performed at the transmitter. The same setup can be used for de-swapping at the receiver, where the incoming bursts are burst-wise stored in the burst memory 11, de-swapped according to the same LUT 16 as in the swapping case, and subsequently forwarded to a de-interleaving stage.

Figure 6:
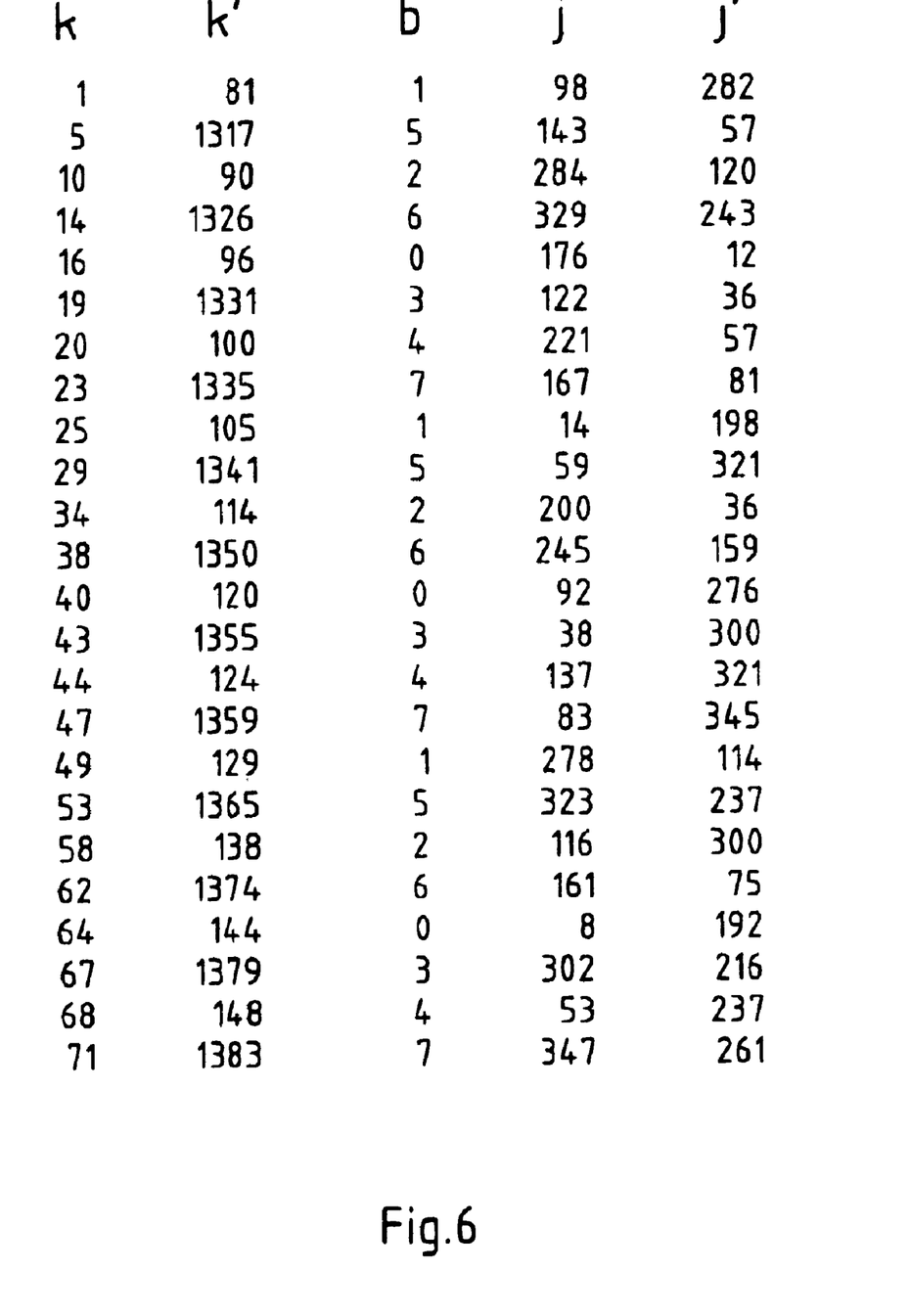
FIG. 6: a table indicating the application of bit swapping according to the present invention in the FLO of GSM/EDGE for a full rate channel with interleaving depth I=8.

FIG. 6 depicts a table that indicates which bits of the TFCI are swapped with bits from the CCTrCH according to the present invention. Such a table may be stored in the LUT 16 of a system for bit swapping as depicted in FIG. 5. Exemplarily, N=80 is chosen, which is divisible by $I_{max}$=16 and larger or equal to the size of the TFCI (L=72 bit), as proposed by the present invention. Note that N=80 was chosen so that the same bit swapping procedure can be applied to all interleaving schemes and interleaving depths possible within the FLO, i.e. taken from the set {4, 8, 16} with R=3. Otherwise, in the present case of block diagonal interleaving with I=8, aiming at bit swapping at the beginning and the end of the CCTrCH, it would have been sufficient to choose N=72, which is larger of equal to the size L=72 of the TFCI and is divisible by I=8.

The first column represents the index k of the bit position within the non-interleaved radio packet 8. The second column represents the absolute position k'=b*J+j of the CCTrCH bit in the non-interleaved radio packet 8 the TFCI bit is swapped with. The third column gives the burst index b in which the swapping occurs. The last two columns contain the bit position j the bit at position k is interleaved to (within the burst b), and the bit position j' the bit at position k' is interleaved to (within the burst b). For instance, the TFCI bit at position k=25 is interleaved to bit position j=14 in burst b=1, which fulfils (14+1) mod 3=0, i.e. this TFCI bit would be transmitted at the third bit position of an 8-PSK symbol and thus has to be swapped. Swapping is then performed between the bit at position k=25 with the bit at position k+80=105 (at the beginning of the CCTrCH). The bit at position 105 is interleaved to j'=198 within burst b=1, which does not fulfil (198+1) mod 3=0. Note that the swapping is always performed for bits within the same burst b in order to maintain the temporal diversity.

Figure 7:
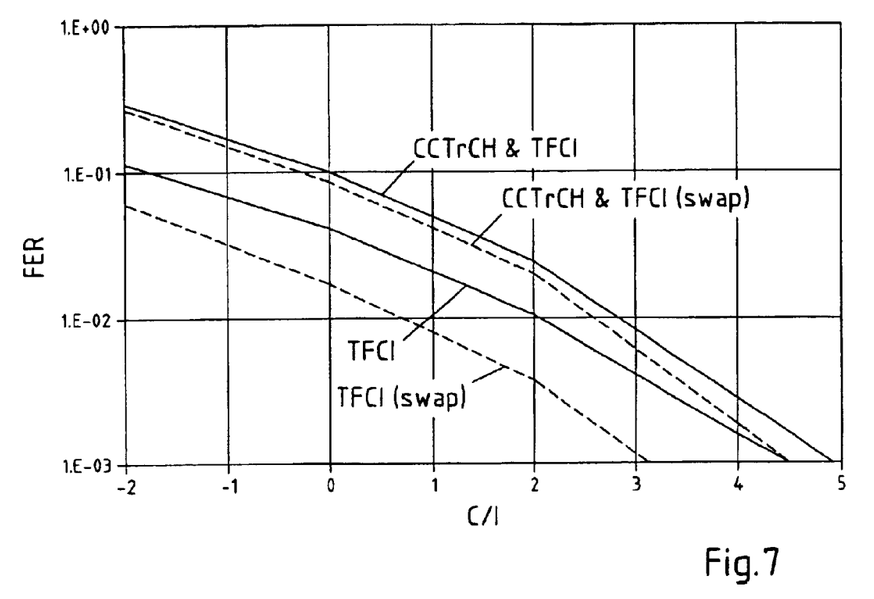
FIG. 7: a first comparison of the frame error ratios that are achieved by FLO radio packets without bit swapping and by FLO radio packets with bit swapping according to the present invention.

FIG. 7 depicts a first comparison of the frame error ratios that are achieved by FLO radio packets without bit swapping and by FLO radio packets with bit swapping according to the present invention. The FLO is configured to carry an Adaptive Multirate Codec (AMR) call at 4.75 kbps on 8-PSK channels with 5 bits TFCI (72 bits coded). As channel model, the TU3iFH channel was used. FIG. 7 shows both the Frame Error Ratio (FER) of the radio packet comprising both TFCI and CCTrCH, and the FER of the TFCI alone, in both cases with (dashed line) and without bit swapping (solid line) according to the present invention and as a function of the Carrier-to-Interference Ratio (C/I) in dB. For the FER of the TFCI, a 1.3 dB gain is achieved by applying bit swapping according to the present invention (at FER= 0.01). The combined FER of the CCTrCH & TFCI then shows a 0.2 dB gain.

Figure 8:
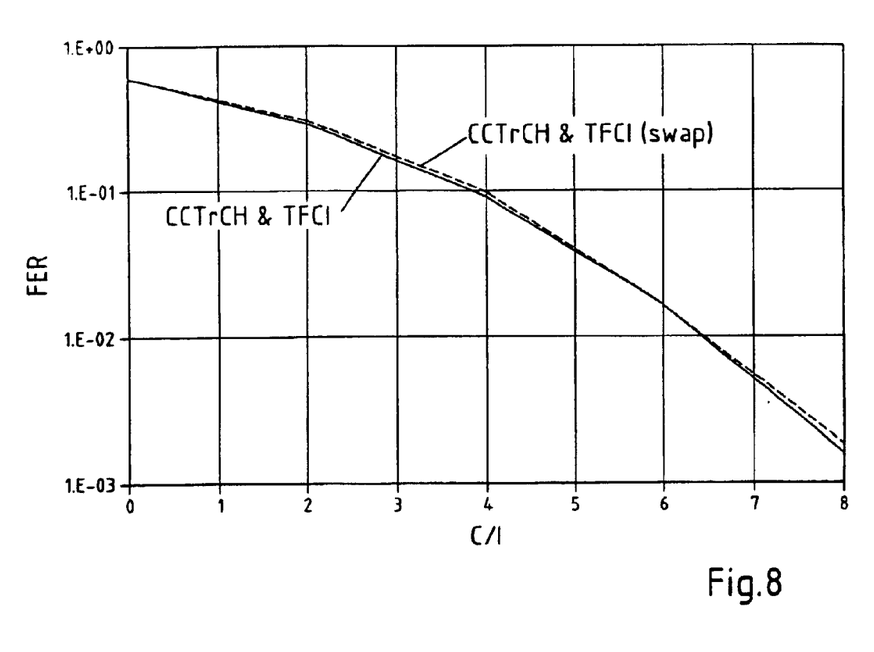
FIG. 8: a second comparison of the frame error ratios that are achieved by FLO radio packets without bit swapping and by FLO radio packets with bit swapping according to the present invention.

FIG. 8 depicts a second comparison of the frame error ratios that are achieved by FLO radio packets without bit swapping and by FLO radio packets with bit swapping according to the present invention. Because more weak bits are used for the CCTrCH as a result of the bit swapping, this could cause some loss in performance when many bits are swapped and when the coding rate of the CCTrCH is high, which corresponds to a low error protection. In order to assess the loss, the FLO is configured to carry an AMR call at 12.2 kbps on the same channels as in FIG. 7. FIG. 8 depicts the results in terms of the FER of the combined TFCI and CCTrCH as a function of the C/I in dB with (dashed line) and without (solid line) bit swapping. The performance degradation due to bit swapping in this scenario is negligible.

The invention has been described above by means of a preferred embodiment. It should be noted that there are alternative ways and variations which will be evident to a skilled person in the art and can be implemented without deviating from the scope and spirit of the appended claims, e.g. bit swapping may be performed during the interleaving step, and different interleaving schemes may be applied, in particular with respect to the arrangement of the interleaved bits within a burst. The scope of the present invention is by no means restricted to 8-PSK modulation or to the GSM/EDGE system. It may also be applied for instance in spread spectrum or Orthogonal Frequency Division Multiplex (OFDM) systems.

What is claimed is:

1. A method for bit swapping, wherein periodically I successive bits of a data packet that comprises K bits are mapped onto interleaved bit positions in I different bursts, respectively, according to a predefined interleaving scheme and a selected interleaving depth I, comprising the step of:
    swapping the value of at least one bit that is associated with a respective first bit position m in said data packet with the value of a bit that is associated with a respective second bit position n in said data packet, wherein said respective second bit position n is selected such that n>m holds and that the difference n−m is divisible by I.

2. A computer program product directly loadable into the internal memory of a digital computer, comprising software code portions for performing the step of claim 1 when said product is run on a computer.

3. A method according to claim 1, wherein said swapping is performed before, during or after said interleaving of said at least I successive bits.

4. A method according to claim 1, wherein said selected interleaving depth I is taken from a predefined set of interleaving depths $\{I_1, \ldots, I_R\}$, wherein $I_r \leq I_{max}$ holds for all r=1, . . . , R, and wherein said respective second bit position n is selected such that the difference n−m is divisible by $I_{max}$.

5. A method according to claim 1, wherein at least one group of bits is defined within said data packet, and wherein said step of swapping is only performed if the interleaved bit position, to which the bit at said respective first bit position m in said data packet is mapped according to said predefined interleaving scheme and said selected interleaving depth I, is a characteristic interleaved bit position, and
    if said bit at said respective first bit position m in said data packet belongs to said at least one group of bits.

6. A method according to claim 5, wherein depending on the modulation scheme, the bits on the characteristic interleaved bit positions suffer from a higher error probability when said bits are modulated, transmitted over a noisy channel and demodulated as compared to the bits on the remaining positions.

7. A method according to claim 5, wherein said characteristic interleaved bit positions are the positions j within a burst that fulfil the criterion that (j+1) is divisible by p, wherein p is a predetermined natural number larger than 0.

8. A method according to claim 5, wherein said group of bits consists of a predetermined number L of first bits of said data packet.

9. A method according to claim 8, wherein said respective second bit position n is selected such that n−m≧L holds.

10. A method according to claim 9, wherein said data packet comprises the bits of a Transport Format Combination Identifier (TFCI) according to a Flexible Layer One (FLO) of a GSM/EDGE Radio Access Network (GERAN) in said group of L bits and the bits of a Coded Composite Transport Channel (CCTrCH) according to said FLO of said GERAN in the remaining K−L bits, wherein the K bits of said data packet are mapped onto said interleaved bit positions in said bursts according to one of the interleaving schemes and one of the interleaving depths I that are standardised for said FLO of said GERAN, and wherein p=3 holds.

11. A method according to claim 10, wherein said step of swapping is performed at least two times for said data packet, wherein the respective first bit position m in each step is different, wherein in at least one of said at least two steps, said respective second bit position n is selected such that n=m+N holds, and wherein in at least one of said at least two steps, said respective second bit position n is selected such that n=m+K−N holds, where N is a predetermined number.

12. A system for bit swapping, wherein periodically I successive bits of a data packet that comprises K bits are mapped onto interleaved bit positions in I different bursts, respectively, according to a predefined interleaving scheme and a selected interleaving depth I, comprising:
    processing means for swapping the value of at least one bit that is associated with a respective first bit position m in said data packet with the value of a bit that is associated with a respective second bit position n in said data packet, wherein said respective second bit position n is selected such that n>m holds and that the difference n−m is divisible by I.

* * * * *